(12) United States Patent
Kushner et al.

(10) Patent No.: US 8,183,889 B2
(45) Date of Patent: *May 22, 2012

(54) COMMON-MODE INSENSITIVE SAMPLER

(75) Inventors: Lawrence J. Kushner, Andover, MA (US); Michael P. Anthony, Andover, MA (US); John S. Fisher, Medford, MA (US)

(73) Assignee: Kenet, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/869,234

(22) Filed: Aug. 26, 2010

(65) Prior Publication Data

US 2011/0210763 A1    Sep. 1, 2011

Related U.S. Application Data

(63) Continuation of application No. 12/011,998, filed on Jan. 29, 2008, now Pat. No. 7,786,767.

(60) Provisional application No. 60/898,216, filed on Jan. 30, 2007.

(51) Int. Cl.
*G11C 27/02* (2006.01)

(52) U.S. Cl. .............................. 327/91; 327/94; 330/258

(58) Field of Classification Search .................... 327/91, 327/94, 307, 337
See application file for complete search history.

(56) References Cited

U.S. PATENT DOCUMENTS

| | | | | |
|---|---|---|---|---|
| 5,963,156 A | * | 10/1999 | Lewicki et al. | 341/122 |
| 6,369,729 B1 | * | 4/2002 | Srinivasan et al. | 341/143 |
| 6,486,820 B1 | * | 11/2002 | Allworth et al. | 341/161 |
| 6,515,612 B1 | * | 2/2003 | Abel | 341/172 |
| 6,768,443 B2 | * | 7/2004 | Willis | 341/172 |
| 6,774,722 B2 | * | 8/2004 | Hogervorst | 330/258 |
| 6,891,487 B2 | * | 5/2005 | Leung et al. | 341/120 |
| 7,023,373 B2 | * | 4/2006 | da Fonte Dias | 341/162 |
| 2004/0075502 A1 | * | 4/2004 | Hogervorst | 330/292 |

* cited by examiner

*Primary Examiner* — Ryan Jager
(74) *Attorney, Agent, or Firm* — Hamilton, Brook, Smith & Reynolds, P.C.

(57) ABSTRACT

An approach to rejecting input common-mode voltage variations in a sampler/converter that avoids the use of a differential amplifier in the signal path, and without introducing added distortion or noise. In one embodiment, the input common-mode variations are sensed on a pair of matched resistors that straddle the common mode analog inputs, on a node 'Vcmi'. An alternative, switched-capacitor-based sensing scheme is also possible. Using this measured Vcmi, adjustments are then made to the rest of the sampler/converter to take out any variations observed at Vcmi.

19 Claims, 12 Drawing Sheets

- Vcmc_samp SETS COMMON-MODE CHARGE OUT OF SAMPLER
- Ccmc PERFORMS CHARGE-PUMP AND LEVEL TRANSLATION vpch = 0;   vfpd AND vfdm SETTLE TO vfdss AT END OF CHARGE TRANSFER vdch ≃ vcmi_s - m1*Vcmc_samp + m2*(Vcm+vfdss); m1 = Ccmc/(Ccmc+2*Cs); m1 = 2*Cs/(Ccmc+2*Cs)
       FOR Ccmc>>Cs:  m1→1, m2→0

Qcm ≃ Vcmc_samp*Cs + vfd_ss * (Cs+Cbp)

ΔQcm/ΔVcm → 0 FOR Ccmc>>Cs, i.e., Qcm IS SUBSTANTIALLY INDEPENDENT OF Vcm OVER TIME

COMMON-MODE INSENSITIVE SAMPLER

RELATED APPLICATIONS

This application is a continuation of U.S. application Ser. No. 12/011,998, filed on Jan. 29, 2008 now U.S. Pat. No. 7,786,767, which claims the benefit of U.S. Provisional Application No. 60/898,216, filed on Jan. 30, 2007. The entire teachings of the above applications are incorporated herein by reference.

BACKGROUND OF THE INVENTION

Figure 1:
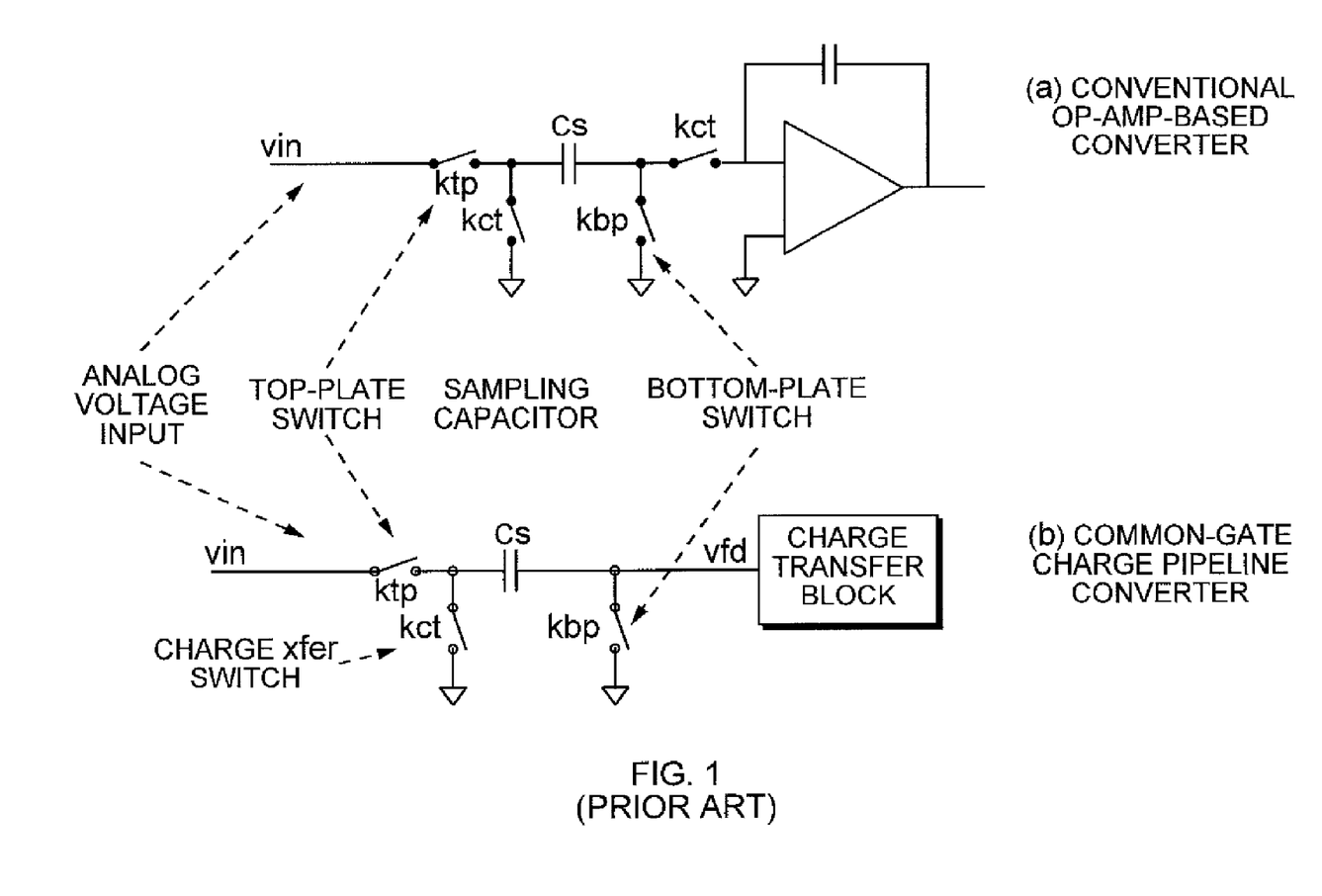
FIG. 1a is a schematic diagram of a conventional op-amp based converter.
FIG. 1b is a schematic diagram of a charge pipeline converter.

In many (high-speed) analog-to-digital converters (ADCs), the analog input-signal is sampled onto input sampling-capacitors prior to conversion. Any intervening circuitry between the analog input and the sampling capacitors can be a source of degradation, adding distortion and/or noise. Therefore, to achieve the highest possible spurious-free-dynamic-Range (SFDR) and highest Signal-to-Noise-Ratio (SNR), many high-performance samplers and ADCs leave out active front-end differential amplifiers, resulting in topologies similar to those shown in FIG. 1. FIG. 1a shows a conventional op-amp based design, and FIG. 1b shows Kenet's Common-gate-charge-pipeline sampling front-end (covered by other patents). Note how both approaches employ the same switch-capacitor network attached to the analog inputs, with similarly timed clocking. The rest of this description will be based on results obtained with Kenet's Common-gate-charge-pipeline, but the unique features of the disclosed sampler could be applied equally well to the conventional approach.

Figure 2:
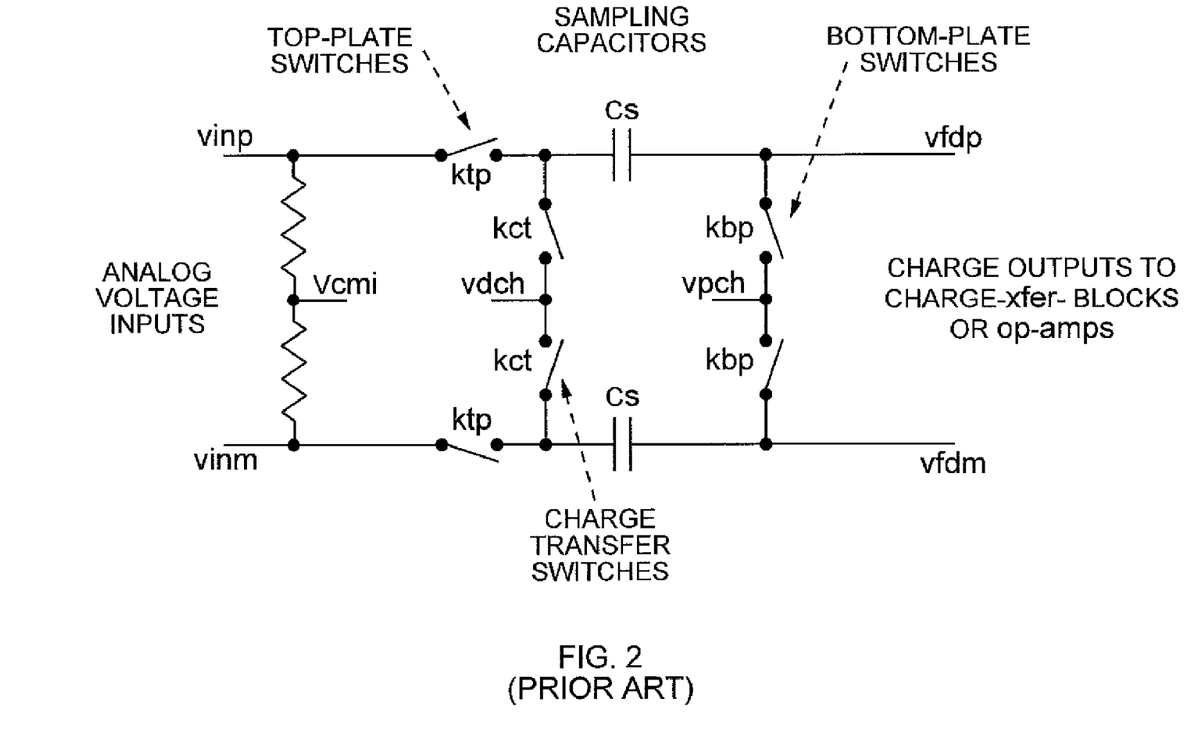
FIG. 2 is a schematic diagram of a charge sampler in a differential configuration.
Figure 3:
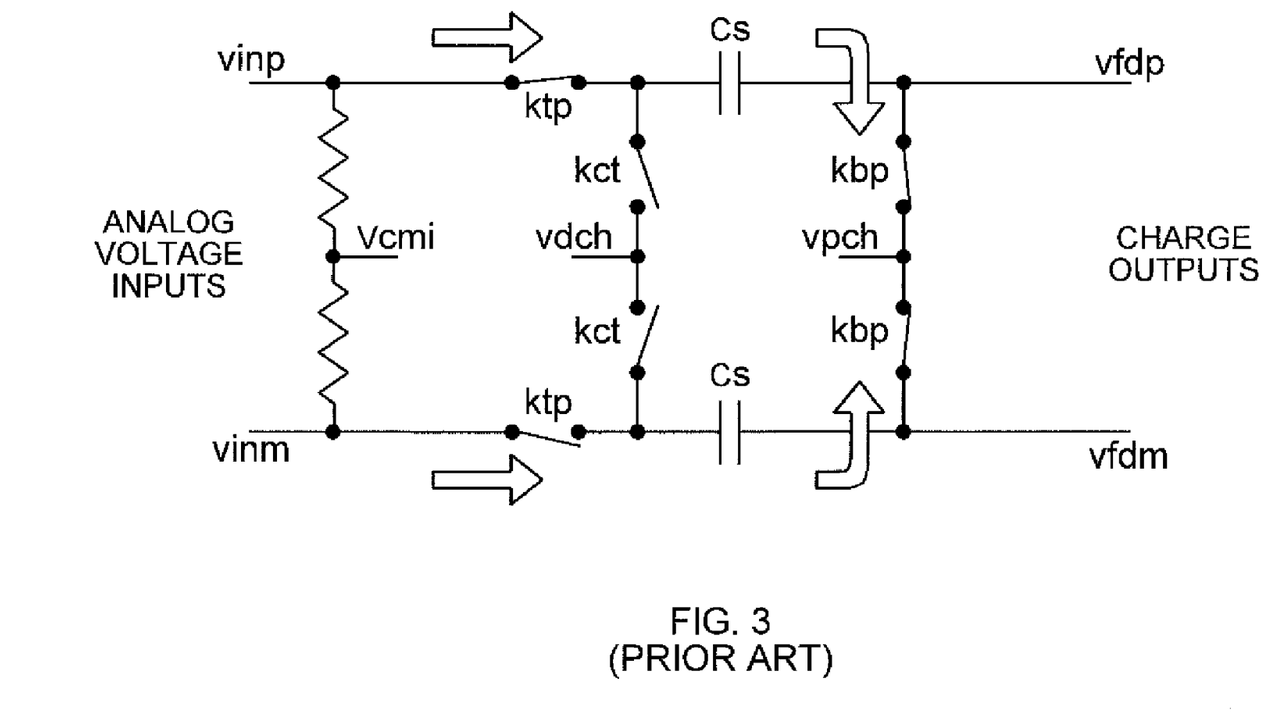
FIG. 3 is a schematic diagram of the sampler of FIG. 2 during a sampling phase.
Figure 4:
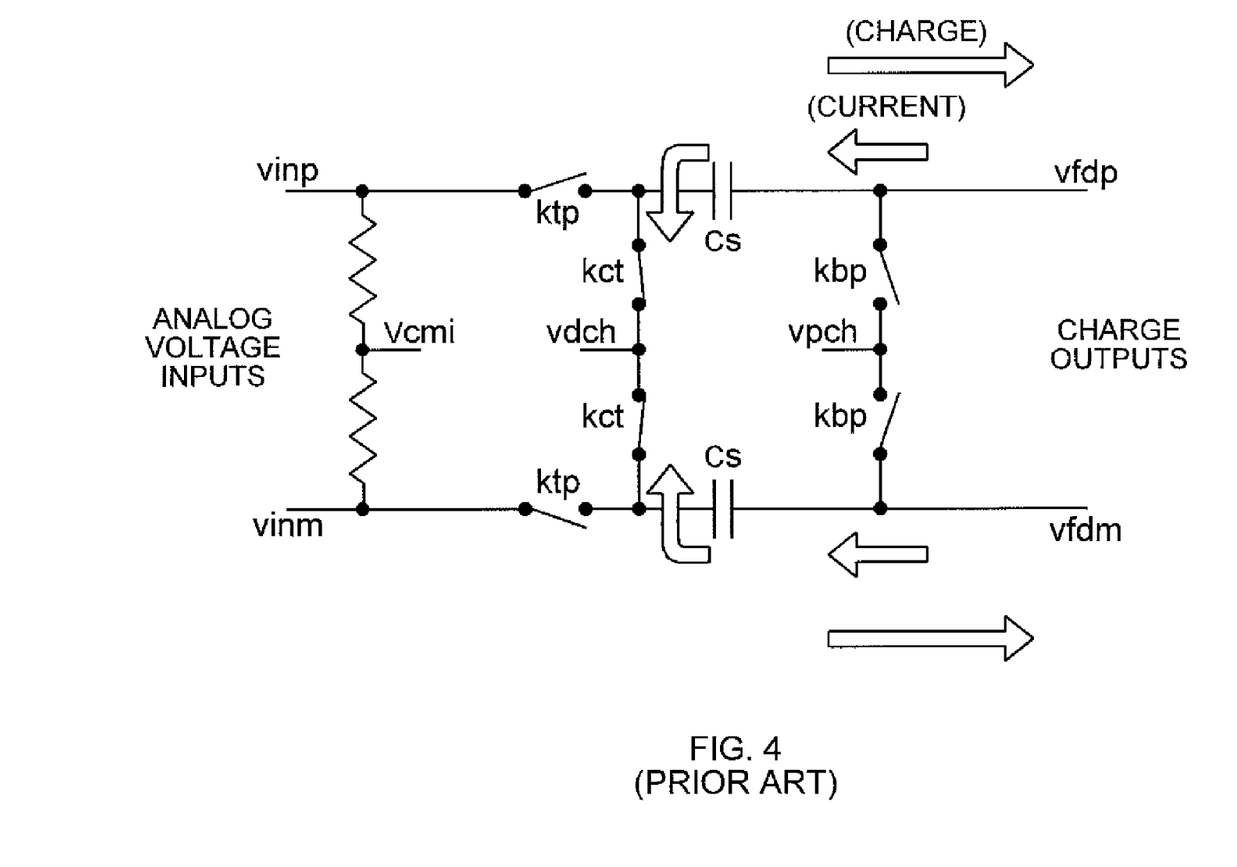
FIG. 4 is a schematic diagram of the sampler of FIG. 2 during a discharge phase.

While a single-ended sampler/converter can be made from the circuits shown in FIG. 1, more commonly, a pair of single-end samplers/converters are mated together to form a differential configuration, as shown in FIG. 2. (Operation of the sampler/converter input circuitry is illustrated in FIGS. 3 and 4, showing the two primary clock phases, track and hold). The circuits are mirrored about the horizontal center-line, creating m (minus) and p (plus) halves of the sampler/converter. Ideally, a differential signal, vdiff, is applied to the vinp and vinm inputs, centered about some common-mode value, Vcm, i.e., Vinp=Vcm+vdiff/2, Vinm=Vcm−vdiff/2.

In practice, most analog inputs, even those intended to be fully differential, have some residual common-mode voltage variation as the differential-signal swings through its range. For example, the inputs of high-speed converters are often driven from transformer-based baluns that perform unbalanced (single-ended) to balanced (differential) conversion. These baluns are not perfect, resulting in a common-mode component at their outputs. Another way to say this is that if vinp and vinm do not have equal amplitudes and exactly 180° relative-phase, a residual time-varying common-mode component will appear at the sampler/converter inputs. The sampler converts input voltage to charge stored on the sampling capacitors, so any input common-mode-voltage variation will result in a common-mode charge variation on the two sampling capacitors. Downstream circuitry must then be able to accommodate this common-mode variation without a loss in performance.

A second approach to driving the converter inputs is to precede the converter with an active differential amplifier, as mentioned above. This differential amplifier can provide some degree of common-mode rejection, like the transformer. But again, real-life amplifiers are not perfect, and they too leave a residual common-mode voltage variation for the sampler/converter to deal with. Additionally, these active amplifiers add distortion and noise, often exceeding that of the sampler/converter itself.

SUMMARY OF THE INVENTION

What is needed is an approach to rejecting input common-mode voltage variations without the use of a differential amplifier in the signal path, and without any added distortion or noise. Embodiments of the present invention provide one such method. The input common-mode variations are sensed on a pair of matched resistors that straddle the analog inputs, on the node marked 'Vcmi' in the accompanying drawings. In an alternative embodiment, common mode variations may be sensed using switched-capacitor circuitry. Using this measured Vcmi, adjustments are made to the rest of the sampler/converter to take out any variations observed at Vcmi.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Figure 5:
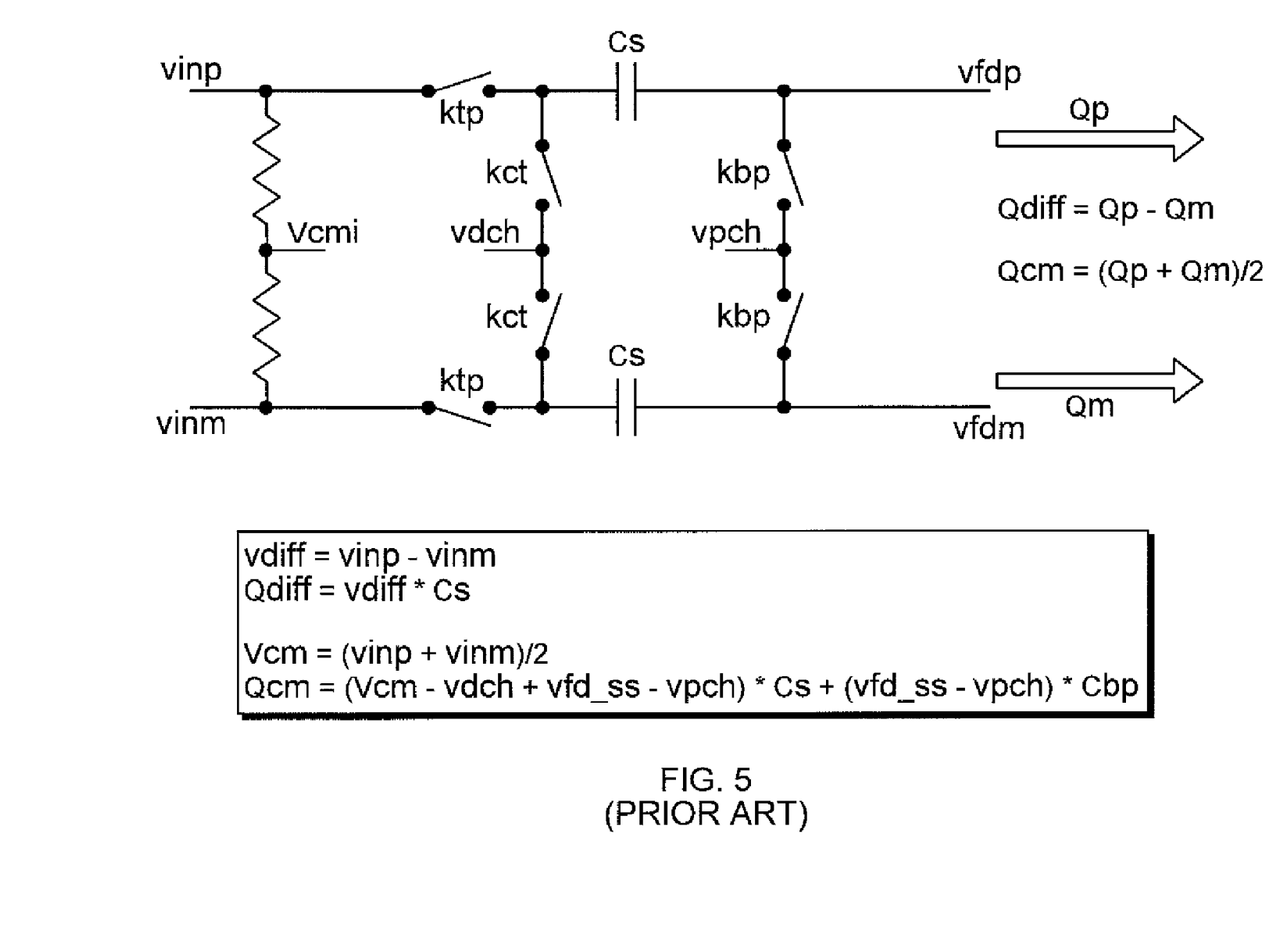
FIG. 5 is a schematic diagram of the sampler of FIG. 2 illustrating the relation of charge output to voltage input.

FIG. 5 provides the relationship between input differential and common-mode voltage, Vdiff and Vcm, respectively, and output differential and common-mode charge, Qdiff and Qcm. The differential-mode output charge is simply the product of the differential-mode input voltage and the sampling capacitance, as desired. On the other hand, the common-mode output charge is a function of the input common-mode voltage, the precharge (Vpch) and discharge (Vdch) voltages, a downstream voltage (Vfdss), the sampling capacitance, and any bottom-plate capacitance (Cbp). In the conventional (or "legacy") sampler of FIG. 6, Vdch and Vpch are grounded, resulting in a common-mode output charge (Qcm) that is equal to a constant plus a term that is the product of the input common-mode voltage and the sampling capacitance. In other words, any common-mode input variations pass directly through this sampler with the same gain as the desired input signal, so this topology provides absolutely no common-mode rejection.

Figure 7:
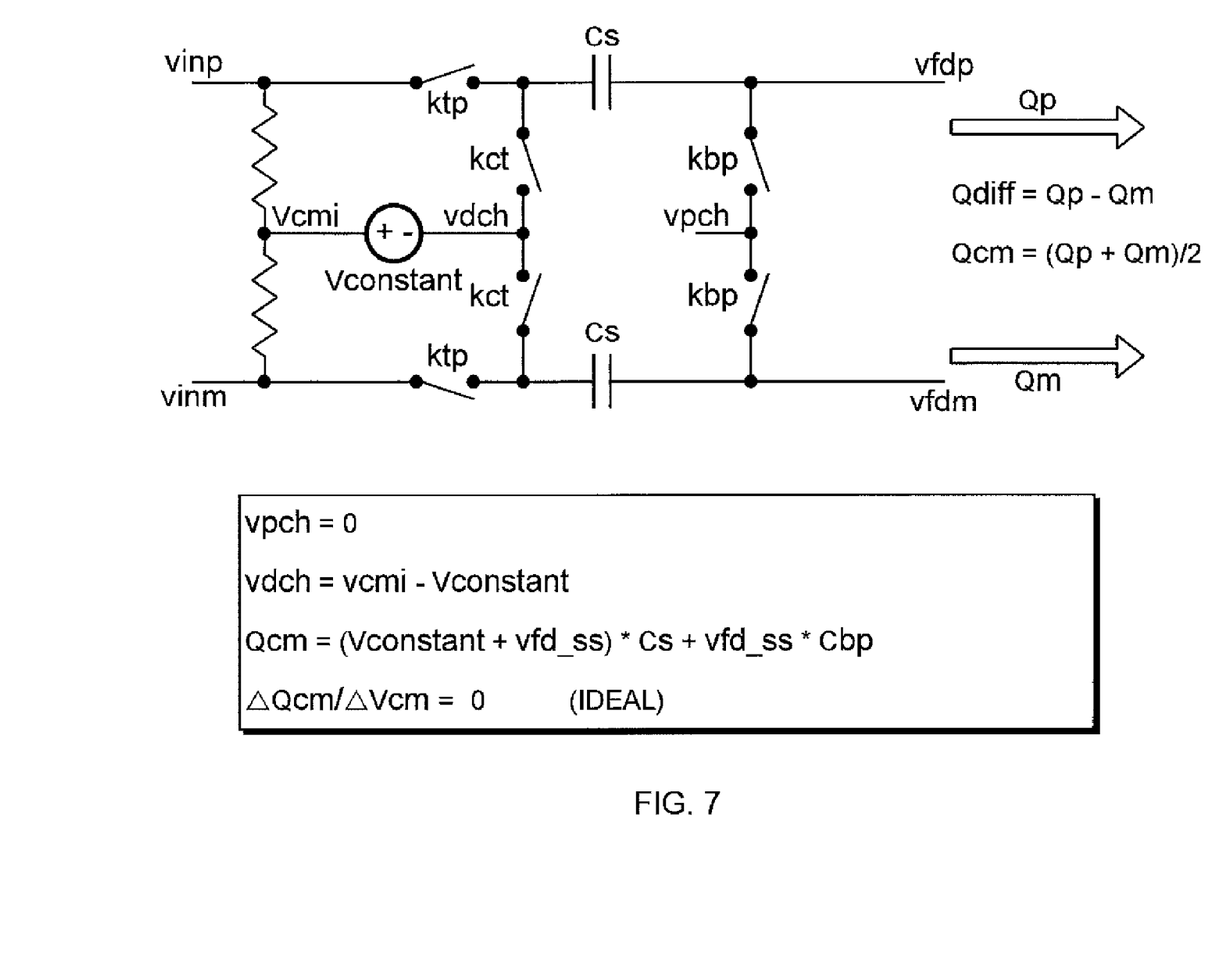
FIG. 7 is a schematic diagram of a common-mode insensitive sampler employing a voltage source.

In contrast, the proposed common-mode-insensitive (Vcm-tracking) sampler of FIG. 7 theoretically has infinite common-mode rejection, as the common-mode output charge is not a function of the input common-mode voltage. To achieve this, an ideal voltage source is needed to maintain Vdch at a constant voltage-drop below Vcmi. In practice, this voltage source will have non-zero output impedance, and also finite operating range. Additionally, if the common-mode input voltage is varying with time, when the input signal is sampled, Vcmi also needs to be sampled at the same time.

Figure 8:
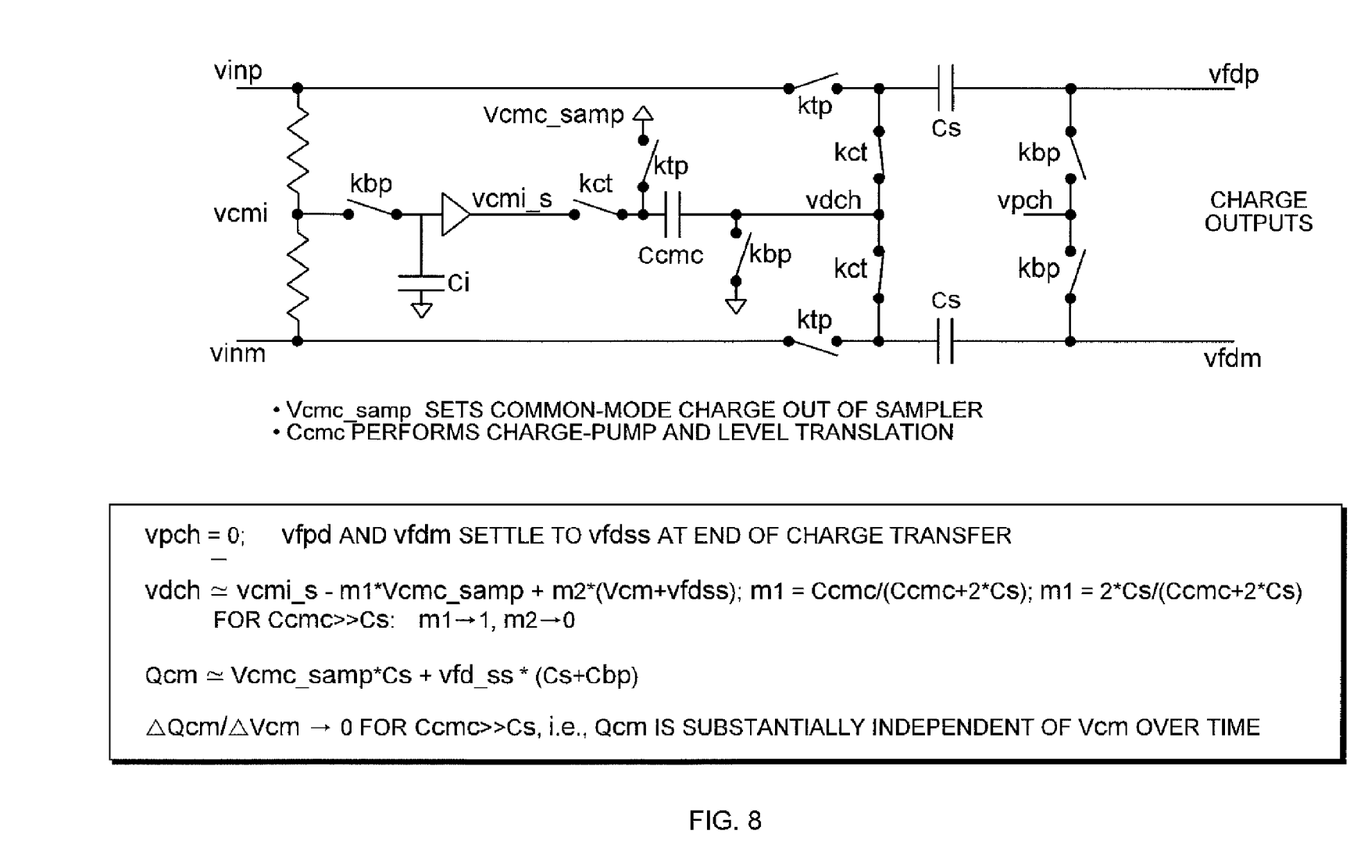
FIG. 8 is a schematic diagram of a common-mode insensitive sampler.

FIG. 8 shows a practical implementation of the Vcm-tracking sampler. An additional sample-and-hold circuit (capacitor Ci and additional switch Kbp) is added to the common-mode sensing path, and followed by a buffer amplifier Ab having low output impedance. While the analog input signals Vinp, Vinm and common-mode signal Vcmi are being sampled onto their respective capacitors (Cs and Ci, respectively), simultaneously, a large common-mode-correction capacitor Ccmc is being charged up to a fixed reference voltage, Vcmc_samp. During the charge transfer phase, the Ccmc is connected in series between the output of the buffer-amplifier Ab and vdch, resulting in a fixed offset between Vcmi_s and Vdch, as desired. To minimize the capacitive division effect between Ccmc and the sampling capacitors, Ccmc can be made relatively large. Since this capacitor is in a path common to both sampler halves, no differential KTC noise is added to the charge outputs. As the value of Ccmc increases, the required Vcmc_samp drops, eventually approaching Vcm. Note that in addition to providing rejection of common-mode input variations, Vcmc_samp can be used as a means to adjust the common-mode output charge of the sampler.

Returning to the operation of the sampler circuit in FIG. 8, the circuit first enters a sampling state to obtain samples of analog input signals Vinp, Vinm and common-mode signal Vcmi. In this sampling state, switches clocked by Kbp and Ktp are closed, while switches clocked by Kct are opened, enabling capacitors Cs to sample respective input signals Vinp and Vinm. Concurrently, the switch connecting Vcmi to Ci is closed, enabling capacitor Ci to sample the common mode voltage Vcmi. As a result, the common mode voltage Vcmi may be sampled simultaneously with the sampling of the input signals Vinp and Vinm. Simultaneously, Ccmc is charged up to Vcmc_samp by a pair of switches controlled by Kbp and Ktp, respectively.

Upon completing sampling of the signals Vinp, Vinm and Vcmi, the sampling circuit may enter a transfer state to transfer the sampled charges via charge outputs Vfdp, Vfdm. Switches controlled by Kbp and Ktp are opened, and switches controlled by Kct are closed. As a result, the buffered-version of the sampled common-mode voltage, Vcmi_s, drives one side of the correction capacitor Ccmc, forcing the other node connected to this capacitor, Vdch, down to Vcmi−Vcmc_samp. This, in turn, drives the charge out of the sampling capacitors into the downstream circuitry. For large Ccmc (Ccmc>>Cc), there is minimal capacitive charge division, so Vdch is held at a constant voltage drop below the common mode input Vcmi, thereby tracking any common-mode variation of sampled charges at capacitors Cs (due to input common-mode changes at Vinp and Vinm). Thus, the sampling circuit provides sampled differential output charges at charge outputs Vfdp, Vfdm having a constant common-mode charge Qcm that is independent of the common mode input voltage Vcmi.

Figure 6:
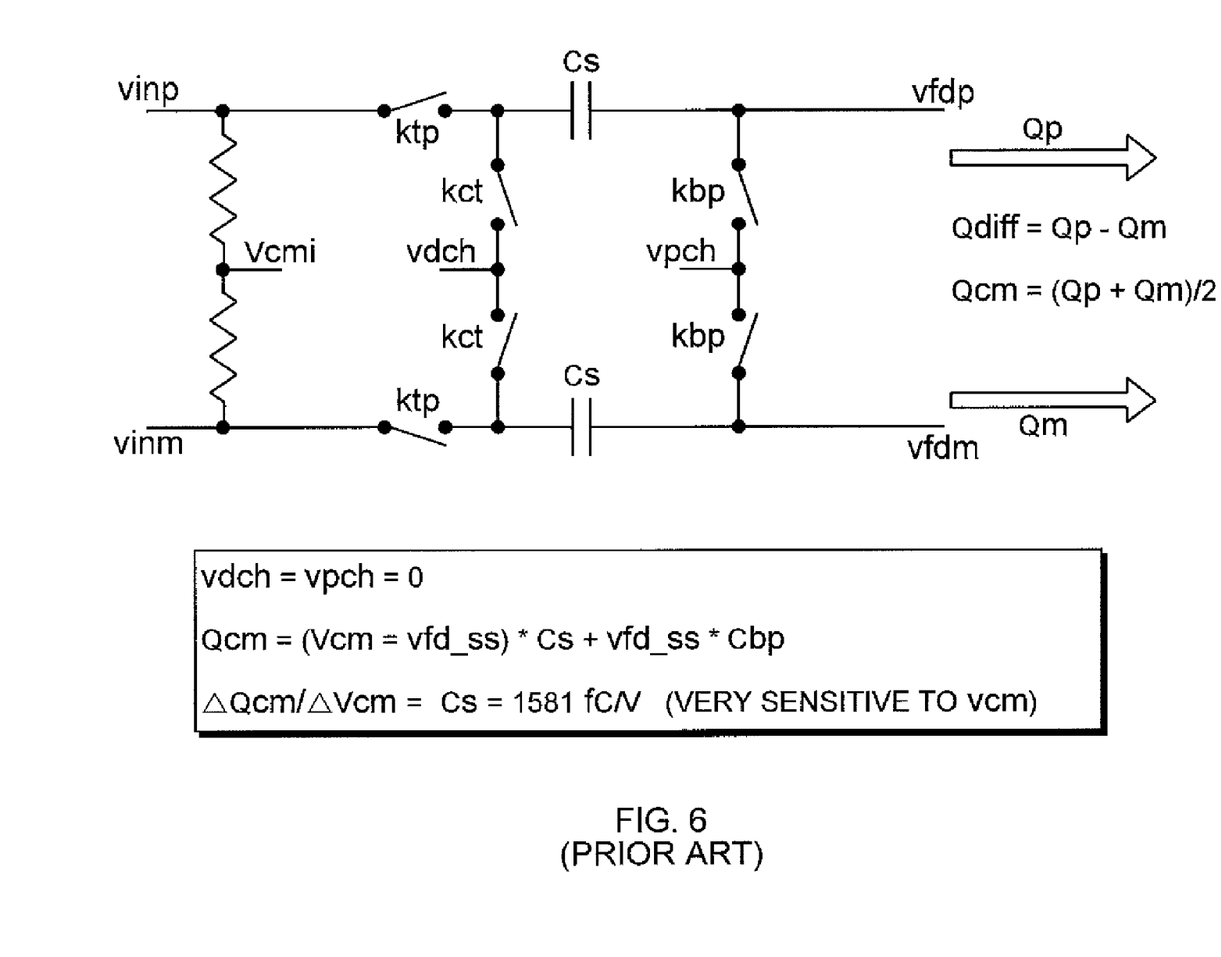
FIG. 6 is a schematic diagram of the sampler of FIG. 2 illustrating the relation of common-mode charge output to common mode voltage input.

Note that in the legacy sampler of FIG. 6, Vdch=0. In the Vcm-tracking sampler of FIG. 8, Vdch is also driven to near 0V for large Ccmc and Vcmc_samp set equal to Vcm. As the input common-mode voltage varies, Vdch in the legacy sampler of FIG. 6 is constant, resulting in variations in output common-mode charge. In contrast, in the Vcm-tracking sampler of FIG. 8, as the input common-mode voltage varies (at Vinp and Vinm), Vdch moves up and down by the same amount to match, maintaining the output common-mode charge (at Vfdp and Vfdm) at a constant value.

Figure 9A:
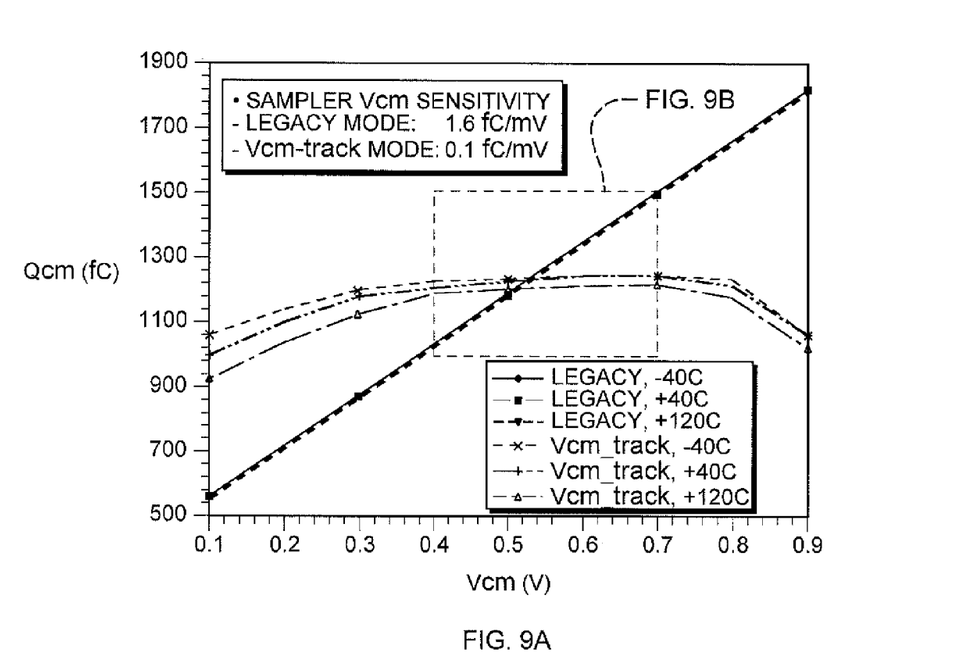
FIG. 9 is a plot of common-mode charge in relation to common-mode voltage for conventional and common-mode insensitive samplers.
Figure 9B:
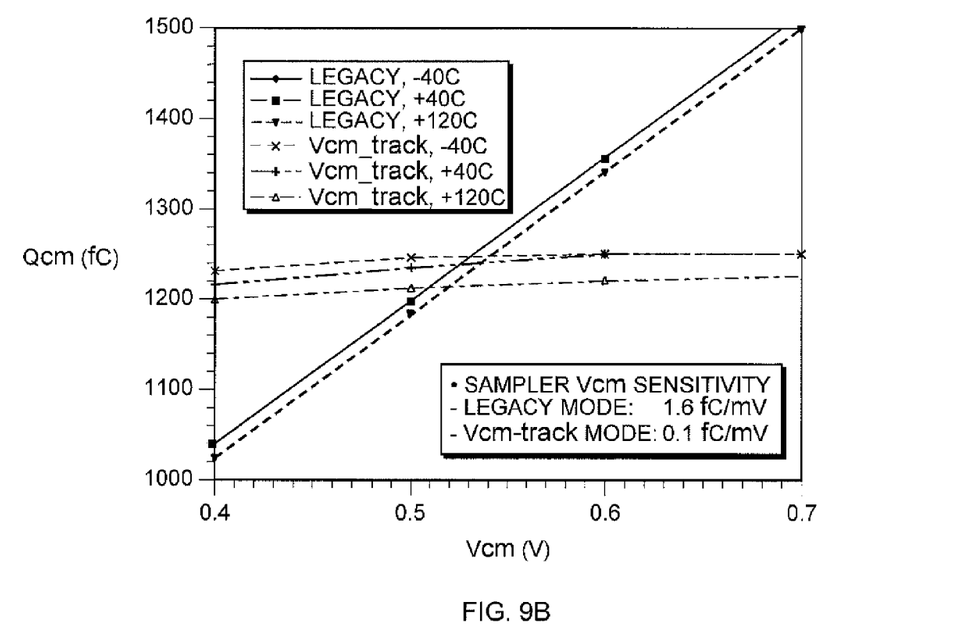

The measured performance of the Vcm-tracking sampler of FIG. 8 is shown in the dc sweeps of FIG. 9. In these sweeps, the input common-mode voltage is swept around its nominal value, while the input differential-mode voltage is set to zero, i.e., vinm=vinp=Vcm. The output common-mode charge is recorded. Two sets of three curves are shown: the legacy-sampler and the vcm-tracking sampler performance, at each of three temperatures, −40 C, +40 C, and 120 C. As expected, the legacy sampler responds directly to changes in Vcm, for this particular sampler, with a slope of 1.6 fC/mV. In contrast, the Vcm-tracking sampler provides about 16× reduction in common-mode charge variation to the downstream circuitry, with a slope of 0.1 fC/mV.

Figure 10A:
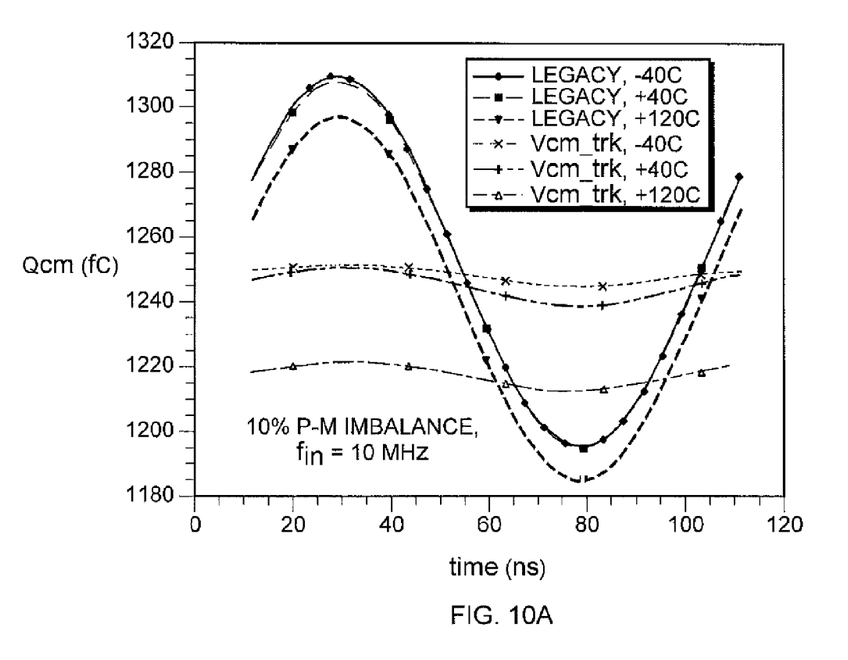
FIG. 10 is a plot of common-mode charge in relation to common-mode, time-varying voltage for conventional and common-mode insensitive samplers.
Figure 10B:
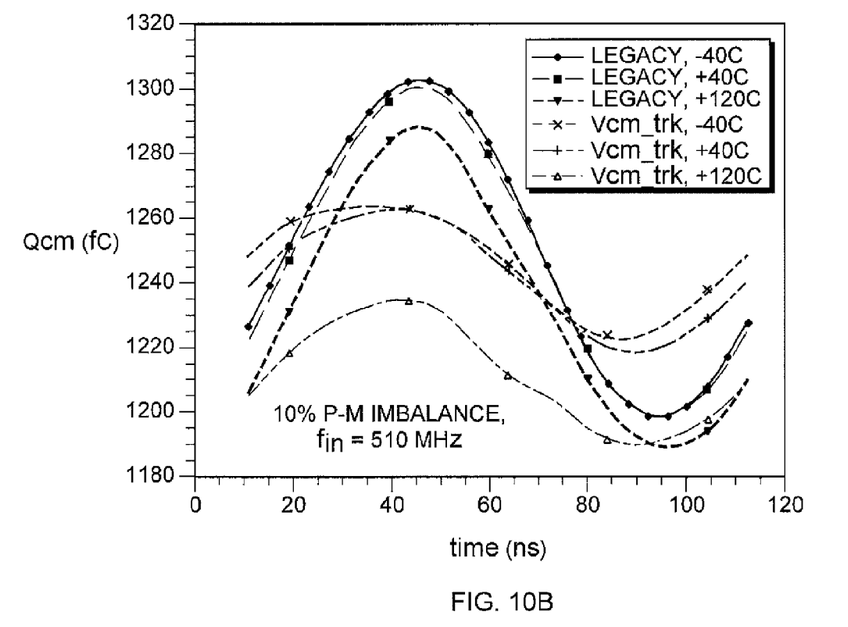
Figure 10C:
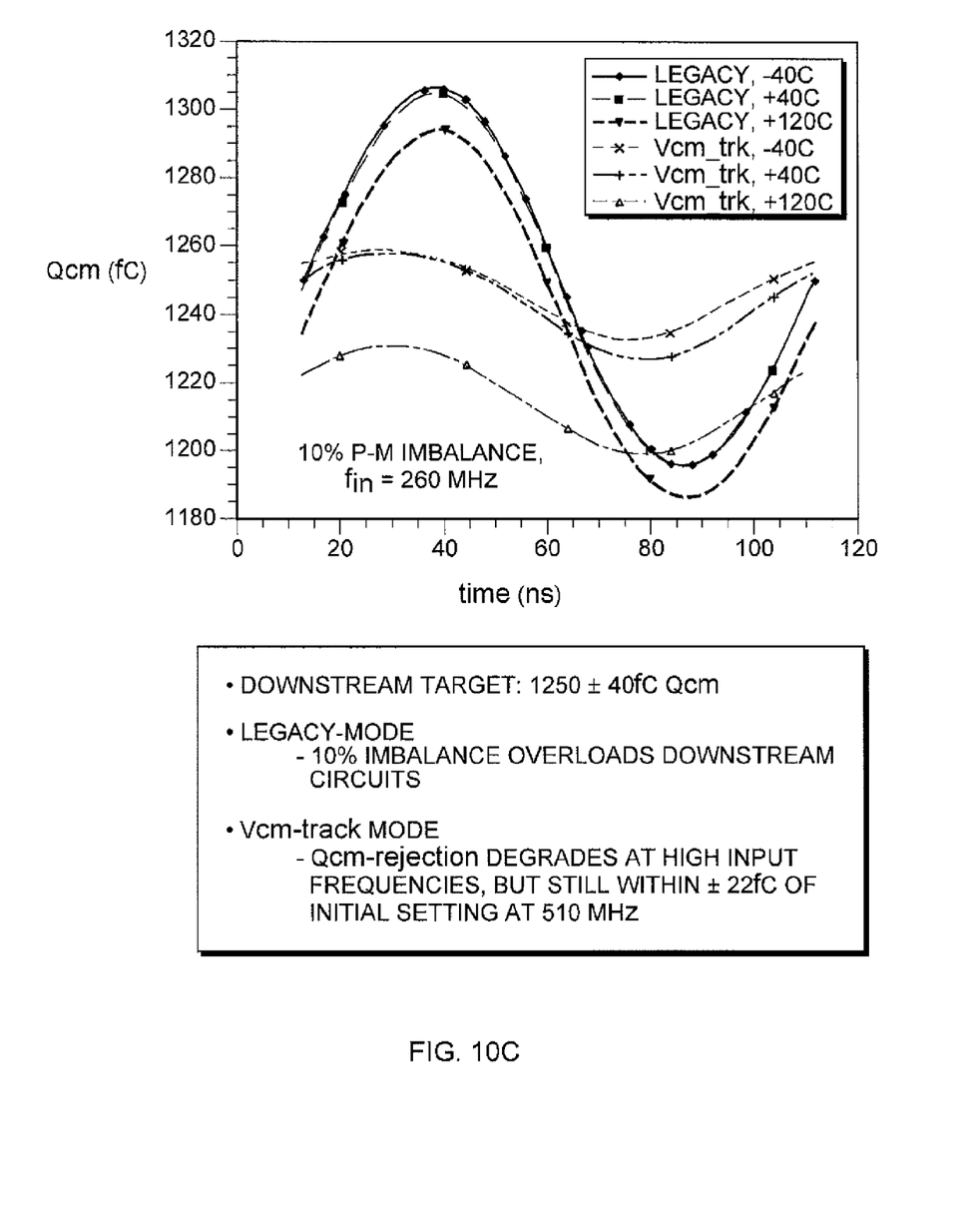

Embodiments of the present invention may provide common-mode variation rejection for time-varying input signals. FIG. 10 illustrates the response of the samplers of FIG. 6 and FIG. 8 to a 10% mismatch in vinm and vinp, at three different input frequencies (10, 260, and 510 MHz), and the same three temperatures. This mismatch produces a large, time-varying input common-mode variation. For all cases, the legacy-sampler (FIG. 6) passes this common-mode voltage fluctuation right through the charge outputs, resulting in unacceptably large common-mode charge variations.

In contrast, the Vcm-tracking sampler (FIG. 8) substantially rejects these dynamic input common-mode signals. The 10 MHz cases are very similar to the dc case shown in FIG. 9, providing a large amount common-mode rejection. As the input frequency is raised, the common-mode rejection gradually degrades, but even at 510 MHz input, the Vcm-tracking sampler still provides about a 2.5 to 3× reduction in output common-mode charge fluctuation.

Figure 11:
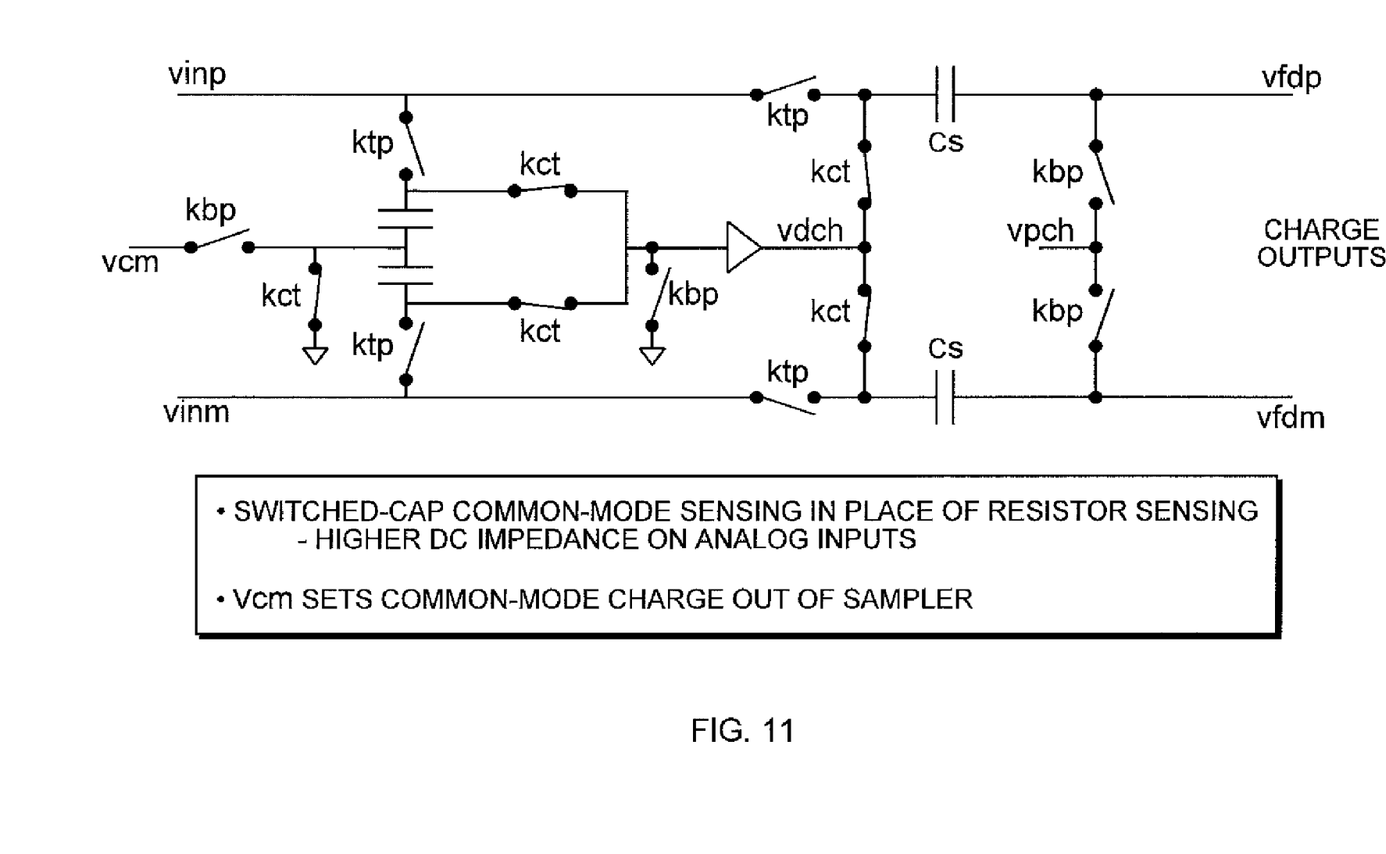
FIG. 11 is a schematic diagram of a switched-capacitor common-mode insensitive sampler.

While most high-speed converters require a relatively low source impedance to achieve high bandwidths, some applications cannot tolerate resistor loads coupled directly to the sampler inputs. For those or other applications, the alternative common-mode sense circuit of FIG. 11 can be employed. This circuit uses a pair of switched-capacitors to sense the common-mode input voltage, and places the buffer amplifier directly on vdch. For applications where vdch needs to be near or below ground, this topology also requires a negative supply rail or charge-pump (not shown) to sink the sampling charge into, as the buffer maintains vdch near zero volts. Note that the Ccmc capacitor in FIG. 8 provides a similar charge-pump function along with the offset function already discussed.

Embodiments of the present invention may also be applied to op-amp-based converters, as shown for example in FIG. 1(*a*). Such converters typically achieve common-mode rejection by way of differential amplifiers. However, a common-mode tracking sampler as described above may be implemented in such a converter to provide common-mode rejection prior to the differential amplifiers. For example, the sampler of FIG. 7 may be configured in a pipeline preceding a differential amplifier (not shown), the differential amplifier receiving inputs Vfdp and Vfdm and providing a corresponding voltage differential.

While this invention has been particularly shown and described with references to example embodiments thereof, it will be understood by those skilled in the art that various changes in form and details may be made therein without departing from the scope of the invention encompassed by the appended claims.

What is claimed is:

1. An apparatus for rejecting common-mode input voltage variations in a differential sampler, comprising:
   a first sampler, for sampling a first differential input voltage, Vinp, the first differential input voltage having a first common mode component;
   a second sampler, for sampling a second differential input voltage, Vinm, the second differential input voltage having a second common mode component;
   a circuit for sensing variations in the first and second common mode component, as a corresponding common mode voltage Vcmi;
   a third sampler, for sampling the common mode voltage, Vcmi;
   a common discharge node, Vdch, connected to the first and second sampler; and
   a voltage source, for maintaining voltage difference between the discharge node, Vdch, and the common mode voltage, Vcmi.

2. An apparatus as in claim 1, wherein the voltage source includes a capacitor Ccmc.

3. An apparatus as in claim 2, wherein the first and second samplers each include a plurality of input sampling capacitors, Cs.

4. An apparatus as in claim 1 wherein the circuit for sensing variations in the first and second input voltages comprises a pair of resistors.

5. An apparatus as in claim 4 wherein the pair of resistors are configured to divide the first and second differential input voltages to indicate the common mode voltage, Vcmi.

6. An apparatus as in claim 1 wherein the circuit for sensing input variations comprises a pair of switched capacitors.

7. An apparatus as in claim 1, with the first and second samplers each further providing an output charge corresponding to the respective first and second input differential voltages.

8. An apparatus as in claim 7, wherein each of the output charges is a plurality of charges having an output common-mode charge that remains substantially constant relative to variation of the common mode voltage, Vcmi.

9. An apparatus as in claim 7, wherein each of the charge outputs are coupled to a differential amplifier.

10. A method for rejecting common-mode input voltage variations in a differential sampler comprising:
    sampling a first differential input voltage, Vinp, to provide a first sampled input voltage having a first common mode component;
    sampling a second differential input voltage, Vinm, to provide a second sampled input voltage having a second common mode component;
    sensing common-mode variations in the first and second sampled input voltages, to detect such common-mode variations as a corresponding common mode voltage Vcmi;
    sampling the common mode voltage Vcmi to provide a sampled common mode voltage;
    discharging current resulting from the first and second sampling steps via a common discharge node, Vdch; and
    maintaining the discharge node, Vdch, at a predetermined constant voltage difference with respect to the common mode voltage, Vcmi.

11. A method as in claim 10, wherein maintaining the discharge node comprises charging and discharging a voltage source, the voltage source including a capacitor Ccmc.

12. A method as in claim 11, wherein sampling the first and second differential input voltages each further comprise charging a plurality of input sampling capacitors Cs, and where the capacitor Ccmc has a capacitance substantially larger than capacitance of each of the input sampling capacitors Cs.

13. A method as in claim 10, further comprising providing a respective output charge corresponding to the first and second input voltages sampled by the first and second samplers.

14. A method as in claim 13, wherein the output charges each have a output common-mode charge that remains substantially constant relative to variation of the common mode voltage Vcmi.

15. A method as in claim 14, further comprising providing the plurality of charges from the first and second samplers to inputs of a differential amplifier.

16. A method as in claim 10 wherein sensing the common-mode input variations comprises charging a pair of switched capacitors.

17. A method as in claim 10 wherein sensing common-mode variations in the first and second differential input voltages comprises sampling via a pair of resistors.

18. A method as in claim 17 wherein the pair of resistors divide a differential input voltage to indicate the common mode voltage Vcmi.

19. An apparatus for rejecting common-mode input variations in a differential sampler, comprising:
    a first sampler, for sampling a first differential input voltage at a terminal Vinp, at a first given time, the first differential input voltage having a first common mode component;
    a first sampler switch, connected between the first differential input voltage terminal, Vinp, and a first sampler node capacitive element of capacitance Cs;
    a first discharge switch connected between the first sampler node and a common discharge node, Vdch;
    a second sampler comprising a second sampler switch, connected between a second differential input voltage terminal, Vinm, and a second sampler node capacitive element of capacitance Cs;
    a second discharge switch connected between the second sampler node and the common discharge node, Vdch;
    a first resistive element connected between the first differential input terminal and a common node, Vcmi;
    a second resistive element connected between the second differential input terminal and the common node, Vcmi;
    the second sampler, for sampling a second differential input voltage, Vinm, at the given time, the second differential input voltage having a second common mode component;
    a third sampler, comprising a third sampler switch, connected to sample the common mode voltage, Vcmi, at the given time and storing the same on a respective sampling capacitive element, Ccmc; and
    a switch control circuit for (a) obtaining samples of the first and second differential input terminals and the common node Vcmi by controlling the first, second and third sampler switches to operate at the same time according to a first clock signal, Ktp, and (b) discharging energy stored in both of the capacitive elements Cs via a common path by operating the first and second discharge switches according to a second clock signal, Kct, so that voltage at the common discharge node Vdch is held at a constant difference with respect to voltage on the common node Vcmi by capacitive element Ccmc.

* * * * *